(12) United States Patent
Baxter et al.

(10) Patent No.: US 7,115,353 B2
(45) Date of Patent: Oct. 3, 2006

(54) COMPUTER SCREEN IMAGING SYSTEM FOR THE PREPARATION OF PRINT SCREENS

(76) Inventors: Gary Baxter, 2768 Cassburn Road, Vankleek Hill, ON (CA) K0B 1R0; Brian Baxter, 46B Mekle Ave., Morrisburg, ON (CA) K0C 1X0; David Kennedy, 118 Kenilworth Ave., Ottawa, ON (CA) K1Y 3Z3; P. Gunnar Wareberg, 1315 Kinsella Drive, Cumberland, ON (CA) K4C 1A9; Steve Wilson, 1055 Cameo Drive, Ottawa, ON (CA) K2C 1Y6; David Rayner, 3128 Quesnel Drive, Ottawa, ON (CA) K1V 7E6; Orson Bourne, 613 Apollo Way, Cumberland, ON (CA) K1A 0R6

( * ) Notice: Subject to any disclaimer, the term of this patent is extended or adjusted under 35 U.S.C. 154(b) by 0 days.

(21) Appl. No.: 10/480,237

(22) PCT Filed: Jul. 9, 2002

(86) PCT No.: PCT/CA02/01041

§ 371 (c)(1),
(2), (4) Date: Jul. 19, 2004

(87) PCT Pub. No.: WO03/007082

PCT Pub. Date: Jan. 23, 2003

(65) Prior Publication Data

US 2005/0072325 A1    Apr. 7, 2005

Related U.S. Application Data

(60) Provisional application No. 60/304,073, filed on Jul. 11, 2001.

(51) Int. Cl.
G03F 7/12     (2006.01)
G03F 7/20     (2006.01)

(52) U.S. Cl. .................. 430/308; 430/494; 355/1; 355/27; 355/40; 355/70

(58) Field of Classification Search ............ 430/308, 430/494; 355/1, 27, 40, 70
See application file for complete search history.

(56) References Cited

U.S. PATENT DOCUMENTS

| | | | |
|---|---|---|---|
| 5,094,933 A | 3/1992 | Uhrig | |
| 5,223,918 A | 6/1993 | Berthold et al. | |
| 5,580,698 A | 12/1996 | Andersen | |
| 5,998,069 A | 12/1999 | Cutter et al. | |
| 6,178,006 B1 | 1/2001 | Pagan | |
| 6,200,737 B1 | 3/2001 | Walt et al. | |
| 2002/0115021 A1* | 8/2002 | Piao | 430/311 |
| 2002/0192569 A1 | 12/2002 | Ulland et al. | |

* cited by examiner

Primary Examiner—Richard L. Schilling
(74) Attorney, Agent, or Firm—Marks & Clerk; S. Mark Budd

(57) ABSTRACT

A system and method for generating a master screen for a silk screen imaging process. Photo activated emulsion is applied to a printing screen and the emulsion is exposed according to a digitized pattern using a light emitting diode (LED) source. The LED source in one embodiment is an array of UV emitting devices which scans the printing screen in a line by line basis.

11 Claims, 4 Drawing Sheets

Fig 2  An exposed silk screen showing the quality of exposure for two different photo-emulsions, scan speeds and LED drive voltage and pulse shape

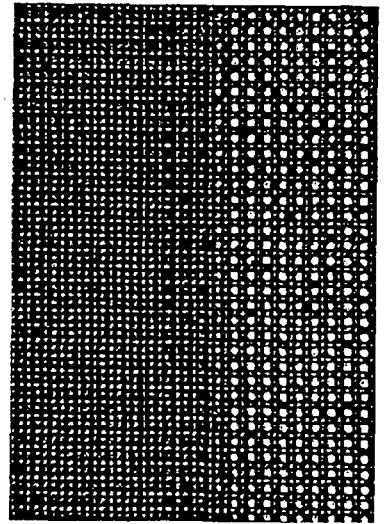
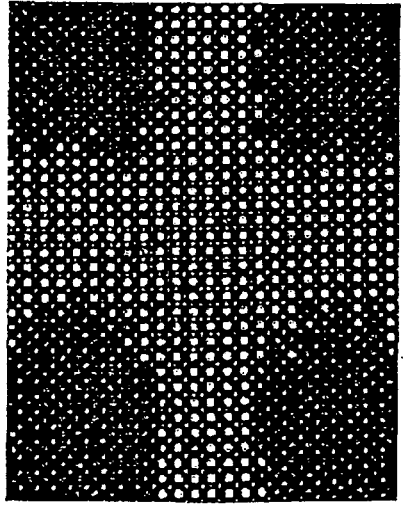
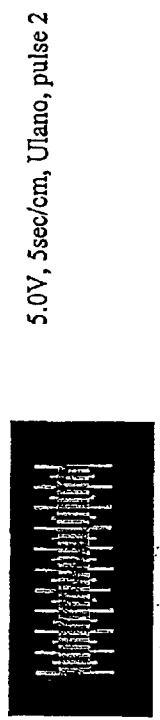
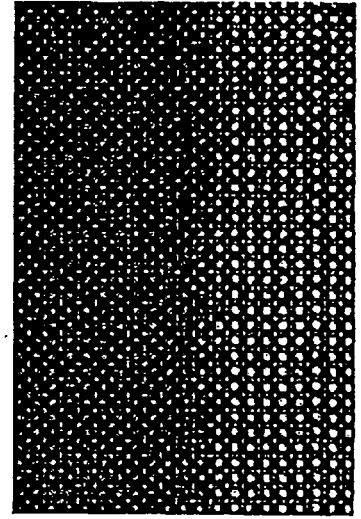
X5 mag
5.0V, 5sec/cm, Ulano, pulse 2
7.5V, 5sec/cm, Majestic 067, Pulse 2
7.5V, 5sec/cm, Ulano, Pulse 2
7.5V, 5sec/cm, Ulano, Pulse 3
Large div=100μm
Fig 3

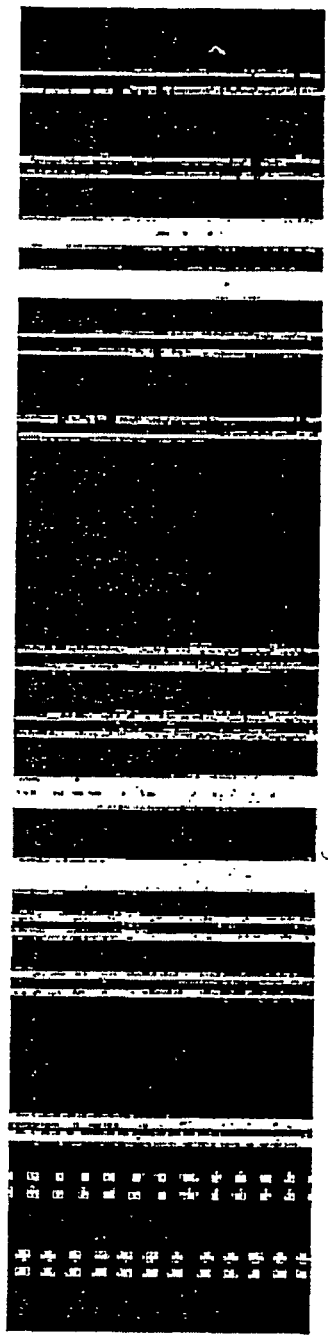
Fig 4: A print prepared using the mask shown in Fig 2

COMPUTER SCREEN IMAGING SYSTEM FOR THE PREPARATION OF PRINT SCREENS

This application claims the benefit of U.S. Provisional Application No. 60/304,073 filed Jul. 11, 2001.

FIELD OF THE INVENTION

This invention relates to a computer to screen (CTS) imaging system and more particularly to a system and method for reproducing a digitized image onto a screen for use in a screen printing process.

BACKGROUND

In certain printing processes, such as silk screen printing, a master screen containing, for example, a negative of a desired image is required. In the printing process this master screen is placed on the surface of the carrier to which the image is to be transferred and ink is imprinted through the master screen.

There are numerous existing techniques for preparing the master screen with one of the most common involving the use of a photographically prepared negative which is placed over a screen onto which has been applied a photo activated emulsion. Such emulsions are typically sensitive to ultra-violet radiation and in this process the screen is exposed to ultraviolet radiation such that the portions of the screen not blocked by the photographic mask are activated. Typically the emulsion is water soluble or at least soluble in a known solvent and in the developing process the non-activated emulsion is removed from the screen thereby leaving a negative of the image. It will be apparent to one skilled in the art that the process can be used to generate a positive of the image.

With ongoing advances in digitized images it is particularly advantageous to directly convert an image from a computer to the master screen. Several methods of performing this conversion have been developed in as much as computer to screen imaging is seen as a method of allowing an operator to modify images or to prepare images based on drawings or other two dimensional formats utilizing a scanning application. Recent improvements in the work flow associated with the actual printing process and the use of digital imaging in the preparation of graphics has made the need for a true CTS an important enabler in order to realise cost benefits produced by other technological improvements.

The prior art methods of preparing master screens using a CTS imaging process include a laser ablation system in which a laser is used to remove material from a fully blocked screen with the non-removed material creating the negative image.

It is also known to use a laser direct imaging in which a laser is scanned point by point over a silk screen coated with a photo activated emulsion to create an image in that emulsion.

As a further known method, ink jet masking is used wherein a negative of the image to be printed is created by using an ink jet to deposit wax onto a screen coated with a photo activated emulsion. The wax blocks the light when the screen is subsequently exposed. Once exposure is completed the wax is removed to produce the final printable image. Another known method is an optical micro electrical mechanical system (MEMS) technique wherein a series of independently controllable mirrors are used to direct light onto a clearly defined and limited area of a screen which has been coated with a photo activated emulsion. Once this area has been activated the mirrors are directed to an adjacent block of the screen and the process repeated. In this manner a full image can be constructed block by block.

U.S. Pat. No. 5,580,698 which issued Dec. 3, 1996 to Anderson describes a system for producing fine printing patterns on large serigraphical printing frames utilising a type of mirror arrangement. In this patent a laser beam is directed through a series of mirrors to a scanner which is moved laterally and longitudinally along sections of a screen and the light source is modulated in order to produce a pattern. The light source is a ultraviolet laser and the pattern is generated in a dot by dot sequence.

In U.S. Pat. No. 6,178,006 a system for plotting a computer stored raster image on a plain photosensitive record carrier is discussed. In this patent the area to be prepared is subdivided into numerous sub areas and each one is processed sequentially.

Each one of the known methods has a number of serious limitations. For example, debris re-deposition is an issue with the laser ablation and like the laser direct image method it is a point by point process. This limits the exposure rate of both methods. With an ink jet approach, wax removal represents another step and another material that must be safely managed and disposed of. Finally, mechanical instability and reliability will be inherent issues with the MEMS method. In fact, this will be true for any projection method.

Accordingly, there is a need for a simple and efficient method of generating a master screen using a computer to screen imaging system.

SUMMARY OF THE INVENTION

In accordance with a first aspect of the present invention there is provided a method of producing a digitized image on a printing screen comprising the steps of: coating the screen with a photo activatable emulsion; exposing the emulsion in accordance with the digitized image utilising a light emitting diode (LED) source to thereby selectively activate the emulsion; and treating the screen so as to remove unactivated emulsion.

In a preferred embodiment the LED source is ultraviolet emitting and the emulsion is ultraviolet sensitive. However, other combinations of LED source wavelength and an emulsion with complementary sensitivity are feasible.

The LED source can be a linear array of LEDs in which the array and the screen are moved relative to each other at a line by line rate and selected devices within the array are activated to expose the emulsion. As an alternative are in a single or multiple-line pattern can be used wherein each array is moved orthogonally across the screen or of course the screen is moved relative to the array.

The LED emitting pixel shape and size are selected to accommodate the resolution requirements and the characteristics desired in the exposed pattern on the screen. The pixel size and shape are established by the LED emitting pixel design or this in combination with an optical system.

BRIEF DESCRIPTION OF THE DRAWINGS

The invention will now be described in greater detail with reference to the attached drawings wherein;

FIG. 3 is a high resolution image of a screen prepared using the emulsions as specified; and FIG. 4 is a print prepared using the mask shown in FIG. 2.

DETAILED DESCRIPTION OF THE INVENTION

Figure 1:
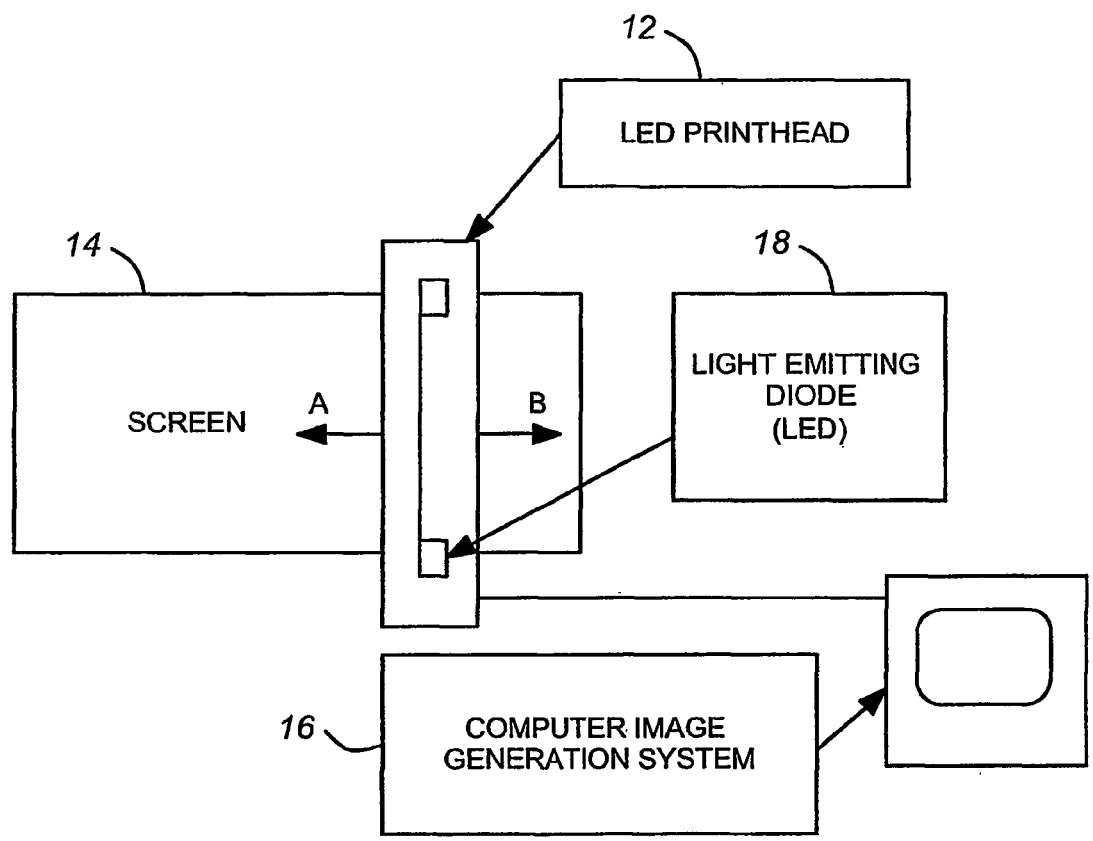
FIG. 1 is a block diagram of the LED printhead screen and imaging system.

As shown in FIG. 1 it is contemplated that the present invention will include in one embodiment a LED printhead 12 which has sufficient length to cover one dimension of the screen 14 onto which the master image is to be formed. A digitized image is fed from the computer image generating system 16 to the LED printhead 12 whereby individual light emitting diodes 18 in the array are activated according to a line by line image pattern. Typically, the LED printhead 12 will complete one line exposure and then be advanced to a subsequent line and the process repeated until the entire screen 14 has been exposed. In a preferred embodiment the printhead 12 is moved relative to the screen as shown by arrows A, B although it is conceivable that the printhead 12 can be held in a fixed position and the screen 14 moved relative to it. As noted above the printhead 12 is moved over the screen in an analogous manner to how the graphic image is digitally encoded. In FIG. 1 the LED printhead 12 spans the width of the screen 14. It will be understood, however, that a smaller LED array or indeed single LED devices can be used to traverse the screen in orthogonal directions.

In a particular embodiment emulsions such as those available under the Trademarks Ulano and Majestic 067, both of which are sensitive to ultraviolet radiation, are used. In this embodiment ultraviolet emitting LEDs are used. It is within the scope of the present invention, however, to use other wavelength emitting LED devices in which case emulsions which are activated by these wavelengths are used. It will also be apparent that if wavelengths in the visible spectrum are used the process will need to be housed in a dark room or a light shielded environment.

Figure 2:
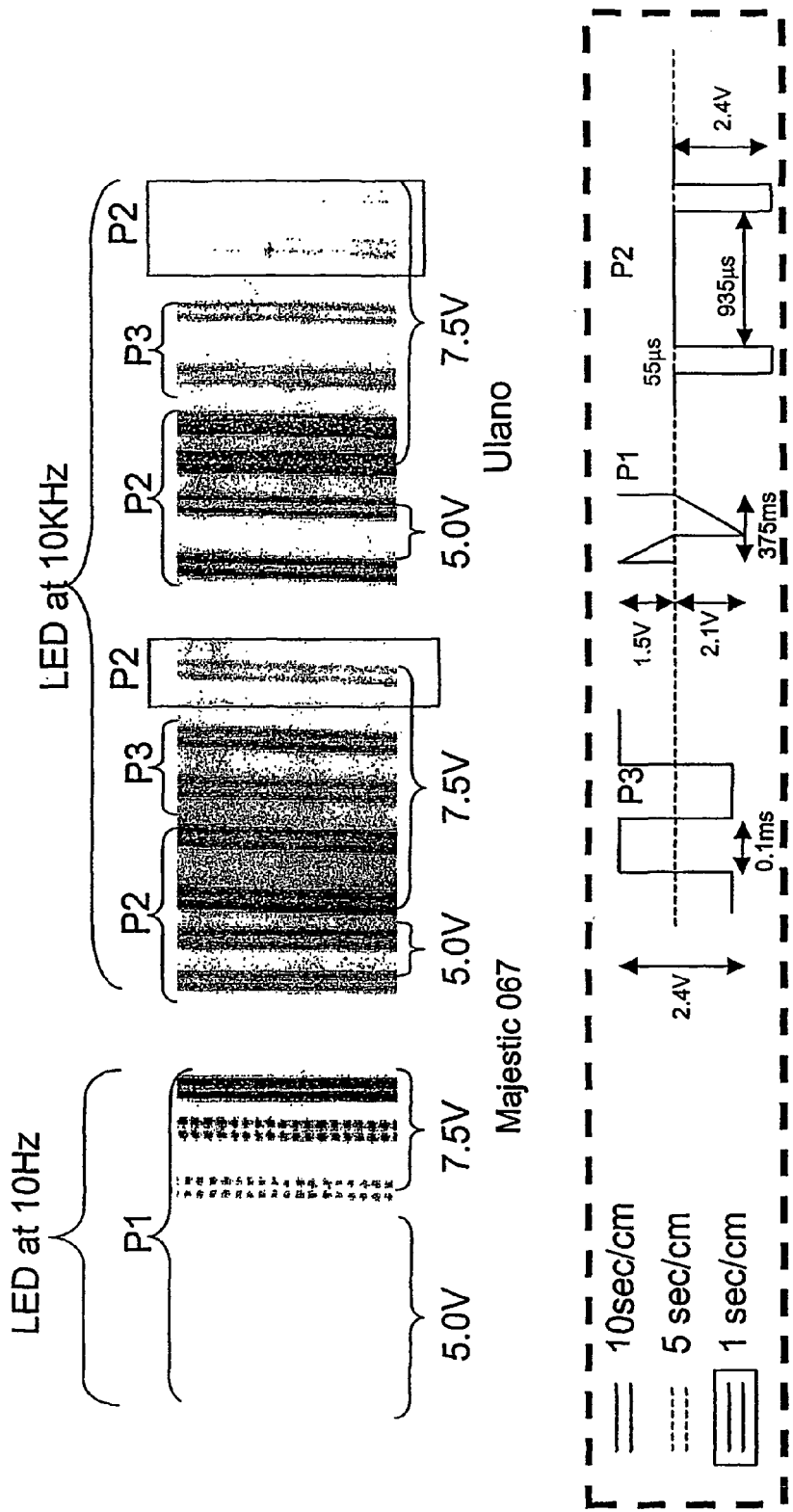
FIG. 2 is an exposed silk screen showing the quality of exposure for two different photo-emulsions, scan speeds LED drive voltage and pulse shape.

FIG. 2 shows an example wherein a pair of LEDs were moved at different speeds over the surface of a silk screen coated with two different but representative photo-emulsions. This example clearly shows that if the right combination of wave length, photo-emulsions, scan speed and light intensity is used it is possible to successfully create the ink block conditions necessary for image transfer in the silk screen printing process.

FIG. 3 contains high resolution images of a screen containing ink blocking conditions. The ink blocking characteristics produced by the LEDs are clearly visible.

FIG. 4 illustrates an image from a screen prepared by this method. The image shown in FIG. 4 was created using the mask shown in FIG. 2.

The present invention describes the method for the preparation of silk screen prints. In this described method the ink blocked mask can be formed either line by line, if each LED in the array is powered simultaneously or point by point if the LEDs are powered sequentially or randomly. Every diode in the array can be independently controlled for power output and activation time (pulse duration) therefore the control of a point by point method is maintained but at a significantly faster exposure rate. The level of control will allow the user to optimise each area of the screen for specific print properties in a manner that cannot be achieved with the ink jet approach or with the MEMS method. Furthermore, because the exposure is digital the method and system is fully compatible with all digital imaging formats.

A system for generating a master print screen according to the present invention will typically include a coating unit (not shown) whereby a photo activatable emulsion is applied to the printing screen. Coating can be performed by rolling, spraying, dipping etc. as is known in the art. The image to be recreated on the print screen is prepared in a digitised form and stored in a computer. The image may be digitised using appropriate design programs or loaded into storage by scanning etc. from an otherwise generated design. The image is passed to the LED printhead in a form such that LEDs on the printhead are appropriately energized to selectively activate the emulsion in order to recreate the image on the emulsion. After the image has been scanned the screen is treated in a developer unit (not shown) to wash away or otherwise remove the unexposed emulsion.

Although particular embodiments of the invention have been described and illustrated it will be apparent to one skilled in the relative art that numerous changes to the basic concept can be implemented. In the foregoing description, for example, numerous references have been made to negatives and processing involving negatives. It is to be understood that processes involving positives can also be used.

The invention claimed is:

1. A method of producing a digitized image on a printing screen comprising the steps of:
   coating the printing screen with a photo activated emulsion;
   exposing the emulsion in accordance with a digitized image utilizing a LED source to thereby selectively activate the emulsion, such that the LED source alone defines the location of the activated emulsion which corresponds to a pixel of the digitized image; and
   treating the screen so as to remove inactivated emulsion.

2. The method as defined in claim 1 wherein said LED source is a LED array.

3. The method as defined in claim 2 wherein said LED source is a linear LED array.

4. The method as defined in claim 2 wherein the screen is exposed on a line by line basis by moving the screen and LED array relative to each other.

5. The method as defined in claim 1 wherein said LED source is at least one LED orthogonally moveable relative to the screen.

6. The method as defined in claim 1 wherein said LED is selected to emit at a wavelength complementary to the sensitivity of said emulsion.

7. The method as defined in claim 6 wherein the LED emits the ultraviolet (UV) portion of the spectrum and the emulsion is activated by UV radiation.

8. The method as defined in claim 1 for use in generating a master screen for such screen printing.

9. A system for generating a master screen containing an image for screen printing comprising:
   a coating unit for applying a photo activated emulsion to a printing screen;
   a computer to screen assembly for digitizing an image to be created on the screen;
   a LED source to receive the digitized image and to expose the emulsion in accordance with the digitized image, the LED source alone defining the location of emulsion to be exposed; and
   a developer unit to remove unexposed emulsion from the screen.

10. The method as defined in claim 1 wherein the LED source alone defines the resolution of the activated emulsion which corresponds to a pixel of the digitized image.

11. The system as defined in claim 9 wherein the LED source alone defines the resolution of exposed emulsion.

* * * * *